United States Patent
Guichard et al.

(10) Patent No.: US 7,400,514 B2
(45) Date of Patent: Jul. 15, 2008

(54) NON-RIGID CONDUCTOR LINK MEASUREMENT SENSOR AND METHOD FOR THE PRODUCTION THEREOF

(75) Inventors: Philippe Guichard, Chabeuil (FR); Jean-Louis Le Corre, Roche sur Grane (FR); Jean-Marie Odermath, Beauvallon (FR); Jérôme Inglese, Guilherand (FR)

(73) Assignee: Thales, Neuilly Sur Seine (FR)

( * ) Notice: Subject to any disclaimer, the term of this patent is extended or adjusted under 35 U.S.C. 154(b) by 302 days.

(21) Appl. No.: 10/571,933

(22) PCT Filed: Oct. 27, 2004

(86) PCT No.: PCT/EP2004/052680

§ 371 (c)(1),
(2), (4) Date: Mar. 15, 2006

(87) PCT Pub. No.: WO2005/050227

PCT Pub. Date: Jun. 2, 2005

(65) Prior Publication Data

US 2006/0276063 A1 Dec. 7, 2006

(30) Foreign Application Priority Data

Nov. 18, 2003 (FR) .................................. 03 13495

(51) Int. Cl.
*H01R 11/01* (2006.01)
*H01R 43/16* (2006.01)
*H01L 23/52* (2006.01)
*H01L 21/00* (2006.01)

(52) U.S. Cl. ....................... 361/776; 257/420; 257/692; 438/117; 29/874

(58) Field of Classification Search ................. 361/776; 438/117; 257/420, 692; 29/874
See application file for complete search history.

(56) References Cited

U.S. PATENT DOCUMENTS

| 4,422,128 A | 12/1983 | Heltmach, Jr. et al. |
| 5,185,042 A | 2/1993 | Ferguson |
| 5,767,404 A | 6/1998 | Kaiser et al. |
| 2003/0057515 A1 | 3/2003 | Fillion et al. |
| 2003/0121698 A1 | 7/2003 | Kyougoku et al. |

FOREIGN PATENT DOCUMENTS

| DE | 42 40 454 A | 6/1994 |
| EP | 0 540 071 A | 5/1993 |
| EP | 1996-05-22 | 5/1996 |

*Primary Examiner*—Evan Pert
(74) *Attorney, Agent, or Firm*—Lowe Hauptman & Ham & Berner, LLP

(57) ABSTRACT

The invention relates to electronic sensors comprising an electromechanical microsensor cell such as a micro-accelerometer, and it more particularly relates to the way in which the microsensor cell per se is mounted in a package that furthermore comprises a printed circuit board carrying the electronic processing circuits associated with the microsensor cell. In order to establish a non-rigid electrical connection between a conductive terminal of the board and a connection pin of the cell, a narrow strip-shaped conductive connection cut by chemical machining from a thin and flexible metal sheet (CuBe) is soldered. The strip comprises at least one circle-arc segment extending over one half-turn or three-fourths of a turn. Its resilience permits very low stiffness in all directions and therefore prevents any transmission of vibrations or shocks to the cell. The manufacture of the connections may be collective for all the connections of a sensor and for successive sensors manufactured serially. Application to accelerometers subjected to large shock and vibration stresses.

20 Claims, 3 Drawing Sheets

NON-RIGID CONDUCTOR LINK MEASUREMENT SENSOR AND METHOD FOR THE PRODUCTION THEREOF

FIELD OF THE INVENTION

The invention relates to electronic sensors comprising an electromechanical microsensor cell such as a micro-accelerometer, and it more particularly relates to the way in which the microsensor cell per se is mounted in a package that furthermore comprises a printed circuit board (or several printed circuit boards) carrying the electronic processing circuits associated with the microsensor cell.

BACKGROUND OF THE INVENTION

For reasons relating to the nature of the sensor and the measurement intended to be carried out, for example the measurement of an acceleration of an object liable to experience large stresses, it is sometimes necessary to mount the cell in such a way that the vibrations of the object carrying the sensor, or the shocks experienced by this object, do not affect the measurement or the structure of the cell. This is because an accelerometer is typically very sensitive to vibrations and shocks, and it would deliver an electrical signal which is difficult to process if a parasitic signal due to vibrations of the object whose acceleration is to be measured were superimposed on the acceleration measurement per se. On the other hand, vibrations and shocks could damage the sensor, which would be even more detrimental. The measurement of acceleration is not the only case in which vibrations and shocks are causes of malfunctions or measurement difficulties, but it does constitute a typical case to which the invention is particularly applicable. Sensors of other physical quantities, produced by micromachining, may typically be affected.

The cell is then mounted in a package with the interposition of a shock and vibration damping element. For example, the cell is wedged in the package by elastomeric wedging blocks whose mechanical damping properties are suitable for the shocks and vibrations to be filtered, and the cell is not in direct physical contact with the package. However, it is necessary to transmit supply voltages or electrical signals between the cell and the electronics board associated with it, which board is also mounted in the package. Care therefore needs to be taken so that the electrical connections do not transmit vibrations and shocks, which the damping elements are intended to absorb, to the cell owing to their stiffnesses.

One possible method of electrical connection between the microsensor cell and the electronics board is represented in section in FIG. 1 and as a plan view in FIG. 2. The cell 10, with its electrical connection pins 12, is contained in a package 20 closed by a cover 22; it is held in place by damping blocks 24 (usually made of elastomer) which support it while absorbing the shocks and vibrations transmitted by the package. The package may be fastened on an object on which a measurement is performed, in which case the fastening (not shown) may be carried out by any means.

The cell lies on the rear face side of an electronics board 30, which carries components 32 and printed conductors 34 on its front face; the board 30 is pierced by holes 36 in which the connection pins 12 of the cell engage freely (without physical contact) through the rear of the board; the ends of the pins are connected by soldered wires 14 to conductive terminals forming part of the printed conductors 34 of the front face of the board; the wires are soldered on the one hand to the end of the pin and on the other hand to a respective terminal associated with this pin; the wires 14 are not straight, but instead are curved so as to act as a spring having a small stiffness in all directions (a straight wire would have a high stiffness in the direction of this straight line).

In order to ensure sufficient electrical conductivity between the board and the pin (preferably less than one ohm), the wires are typically made of bare gold or aluminum, or copper insulated by a plastic sheath, or copper or silver coated with an insulating enamel, etc. The diameter of the conductive wire is typically 50 micrometers, and its length is a few millimeters. The wire must be preformed before or during the soldering operation in order to give it the curved shaped which ensures a low stiffness in all directions and, like the operation of holding the wire when soldering, this preforming operation is difficult to carry out.

It has been observed that the modules produced in this way are excessively sensitive to vibrations, which prevents correct measurement.

Another way of producing the connection between the sensor and the board may consist in using a flexible printed circuit layer, as is done in printers, camcorders, etc. However, these layers are generally not flexible enough because of the relatively rigid insulating plastic material on which the electrical connections rest.

There is therefore a need for a method of simple connection with very low stiffness between the cell and the electronics board of a sensor liable to be subjected to large vibration stresses. It is an object of the invention to provide a solution which at least partly improves the known solutions.

SUMMARY OF THE INVENTION

The sensor according to the invention comprises a package, a microsensor cell wedged in the package by damping blocks, and an electronics board comprising electronic circuits associated with the cell, the cell comprising connection pins, flexible conductive connections being provided between the connection pins and printed conductors of the board, this sensor being characterized in that each conductive connection comprises a thin and flexible metal strip machined by cutting, extending between the pin and a printed conductor passing close to the pin, the strip being electrically connected on the one hand to the conductor and on the other hand to the pin and comprising, between the conductor and the pin, an arc-shaped segment parallel to the plane of the board and extending freely above the board with a space between the strip and the board.

Preferably, the strip cut from a metal sheet is electrically connected to the pin and to the printed conductor by soldering.

The arcs (preferably circle arcs) corresponding to various conductive connections are preferably identical. They preferably extend over at least 180°, and preferably over three-fourths of a turn. The width of the strip at the position of the arc is preferably less than the width of the strip in the strip segments extending between the arc and the pin, or between the arc and the conductor of the printed circuit. The width of the arc may be a few tens of micrometers, for example from 70 to 100 micrometers for a sheet with a thickness of about 50 micrometers; this small width and this small thickness, combined with the curvature of the arc, give the conductive connection a very low stiffness in all directions, and it should be noted that the stiffness in the direction perpendicular to the sheet is much less than that which would be necessary in order to support the cell, the latter being completely supported by the damping blocks. The connections are not therefore means of supporting the cell, but means of transmitting electrical voltages and currents, which do not transmit mechanical stresses to the cell.

One of the ends of each conductive connection preferably comprises a ring, through the center of which the connection pin of the cell passes. The other end of the connection may also comprise a ring, through which a spike soldered to the printed conductor passes, the thin metal strip then being soldered onto this spike. The material of the metal sheet is preferably an alloy of copper and beryllium, selected because of its resilience properties which are superior to those of copper, and its electrical conductivity which is similar to that of copper.

The manufacturing method proposed according to the invention is particularly economical because it uses collective machining of a set of electrical connections.

The invention therefore relates to a method for manufacturing a sensor comprising a package in which a microsensor cell, wedged in the package by damping blocks, and a printed circuit board associated with the cell are mounted, the method comprising the following operations:

machining a thin and flexible metal strip by cutting so as to form a plurality of narrow strip-shaped conductive connections from this strip, which have a very small stiffness in all directions, each connection comprising a segment curved in an arc in the plane of the sheet, these connections each being intended to connect a respective connection pin of the cell to a printed circuit conductor of the board which passes close to the pin, the various connections being joined together by bridges forming part of the sheet, placing the cell close to the board and soldering each connection on the one hand to a pin and on the other hand to a corresponding conductor, while leaving a free space above the board between the arcuate segment of the narrow strip and the board, and cutting the bridges between connections in order to separate them from one another.

The machining of the sheet is preferably chemical machining by photolithography.

The cutting of the sheet preferably includes the cutting of openings at the positions where components are placed on the board, the sheet being placed on the board onto which components have previously been soldered. Not only the components but also conductive spikes may be soldered onto the board, and the conductive connection is soldered to the free end of these spikes.

The narrow strip may comprise ring-shaped terminations, in which case this ring is threaded around a pin of the cell or a conductive spike soldered onto the board, before soldering the ring onto the pin or spike.

BRIEF DESCRIPTION OF DRAWINGS

Other characteristics and advantages of the invention will become apparent on reading the following detailed description, which is given with reference to the appended drawings in which.

DETAILED DESCRIPTION OF PREFERRED EMBODIMENTS

Figure 1:
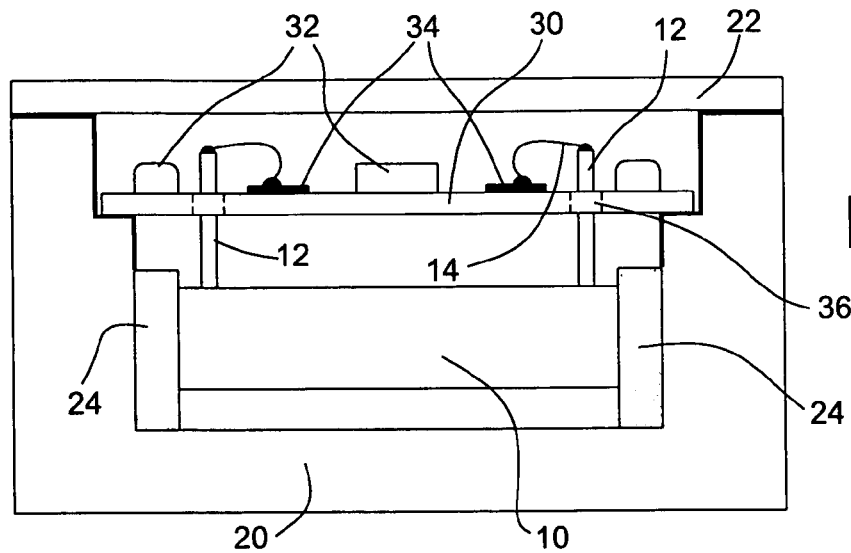
FIGS. 1 and 2, already described, represent the connection of a microsensor cell to a board by copper wires.
Figure 2:
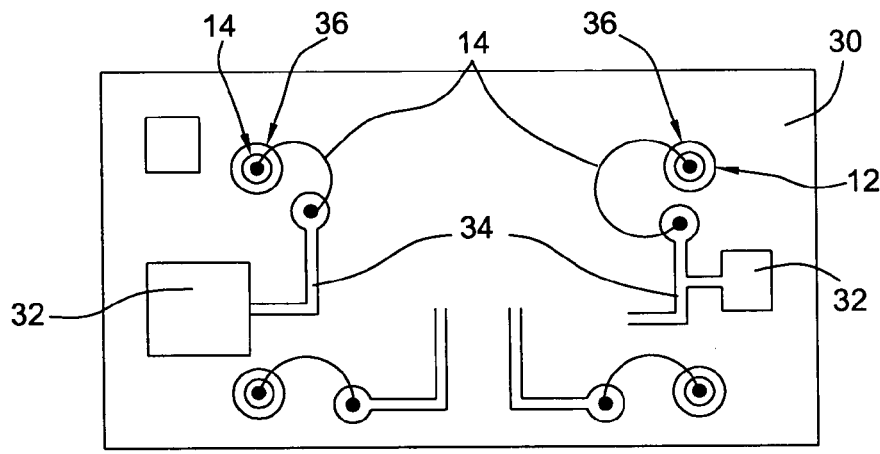

The general structure of the sensor according to the invention is that of FIGS. 1 and 2, apart from the conductive connections between pins 12 of the cell and conductors 34 of the printed circuit board, and this general structure will not be described again. In the preferred example, the cell is placed at the rear of the board and the pins pass through the board in order to reach the front face side, although the cell could also lie on the front face side (the one carrying the electronic components), in which case the pins do not need to pass through the board.

Figure 3:
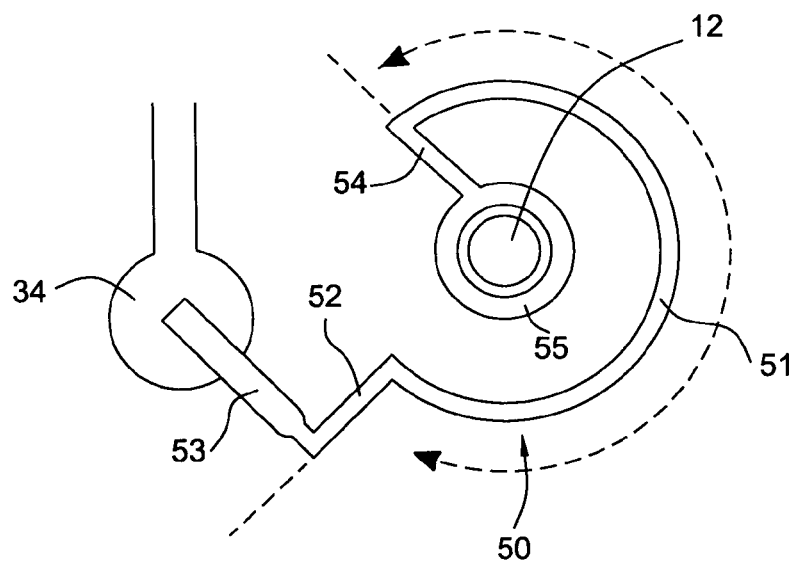
FIG. 3 represents a plan view of an individual conductive connection intended to connect a pin of the cell to a conductive terminal of the board.

FIG. 3 represents a conductive connection 50 placed (but not soldered) over a connection pin 12 of the cell and a conductive terminal 34 printed on the board; the connection 50 is intended to connect this pin to this terminal. The hole 36 pierced in the board, into which the pin 12 close to the terminal 34 can be threaded freely, is not represented in FIG. 3 since it is masked by a part of the conductive connection which covers it.

The conductive connection is a very low stiffness connection, which is not intended to physically support the weight of the cell, and the set of conductive connections associated with the various pins cannot support this weight. The weight of the cell, like the acceleration forces which it may experience, is entirely supported by the damping blocks 24 made of elastomer, as seen in FIG. 1.

The individual connection 50 is cut from a thin flexible metal sheet, preferably by chemical machining based on a photolithographic pattern. The thickness is selected in order to give the connection a very low stiffness in the plane perpendicular to the metal sheet, i.e. in the plane perpendicular to the printed circuit board during operation. The order of magnitude of the thickness is 50 micrometers. The sheet is made of resilient material and is a very good conductor of electricity. The material is preferably an alloy of copper and beryllium, such as the alloy $CuBe_2$.

The shape of the cut-out connection is a narrow strip (the width may be of the order of 70 to 100 micrometers, for example, over the majority of the length of the strip), the small width being selected in order to give the connection a very low stiffness in the plane of the sheet. The narrow strip is not straight, but has a main part 51 curved in an arc parallel to the plane of the sheet. The arc is preferably a circle arc and it extends over a large sector, preferably at least 180°, and in this example about three-fourths of a turn. The length of the arc may be of the order of 1 cm. The circle arc is represented as being centered on the pin 12 in the example drawn in the figures, although this is not obligatory and the pin is not even necessarily located inside the curvature of the arc. This arc shape extending over a large sector is intended to give the conductive connection a very low stiffness in all directions of the plane of the sheet.

One end of the circle-arc strip part 51 is connected by a first segment 52 of small width (for example the same width as the circle arc) to a wider second segment 53 (order of magnitude: about 300 or 400 micrometers) which constitutes a first termination of the connection. In this example, the segment 52 extends radially from the center of the circle arc. Another end of the circle-arc strip part is connected by a third segment 54, here also a radial segment of small width, to a fourth segment 55 which constitutes a second termination of the connection.

The segments 52, 54 preferably depart at a right angle from the ends of the segment 51. Their function is to allow it to work essentially in torsion and not in flexion, like a coil spring.

The circle-arc strip and the various segments are configured so that the first termination can lie above the conductive terminal 34 when the first termination is above the pin 12.

The second termination 55 is shaped as a ring surrounding the pin 12; the width of the ring is preferably greater than the width of the segment 54.

The first termination 53 is represented in FIG. 3 as being a linear bar whose end can be soldered to the conductive terminal 34; it will be seen below that this termination 53 may also have a ring shape.

The soldering between the first termination and the conductive terminal may nevertheless be indirect, in so far as a conductive spike may be inserted into a hole of the board at the center of the terminal 34, this spike being soldered to the conductive terminal and the first termination then being soldered to the upper part of the spike.

Figure 4:
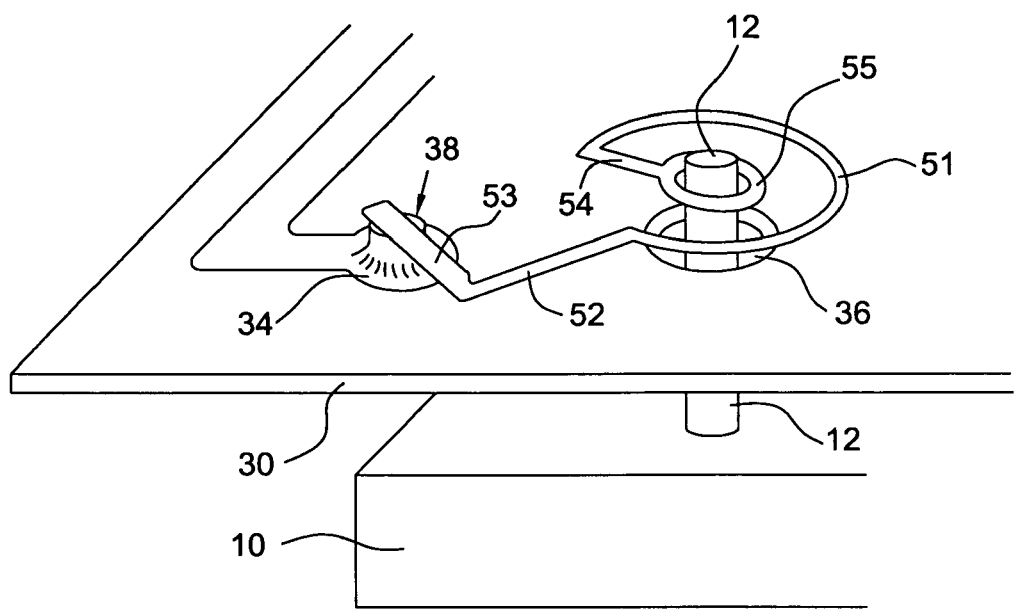
FIG. 4 represents in perspective the way in which a conductive connection is mounted on the board before the connection is soldered.
Figure 5:
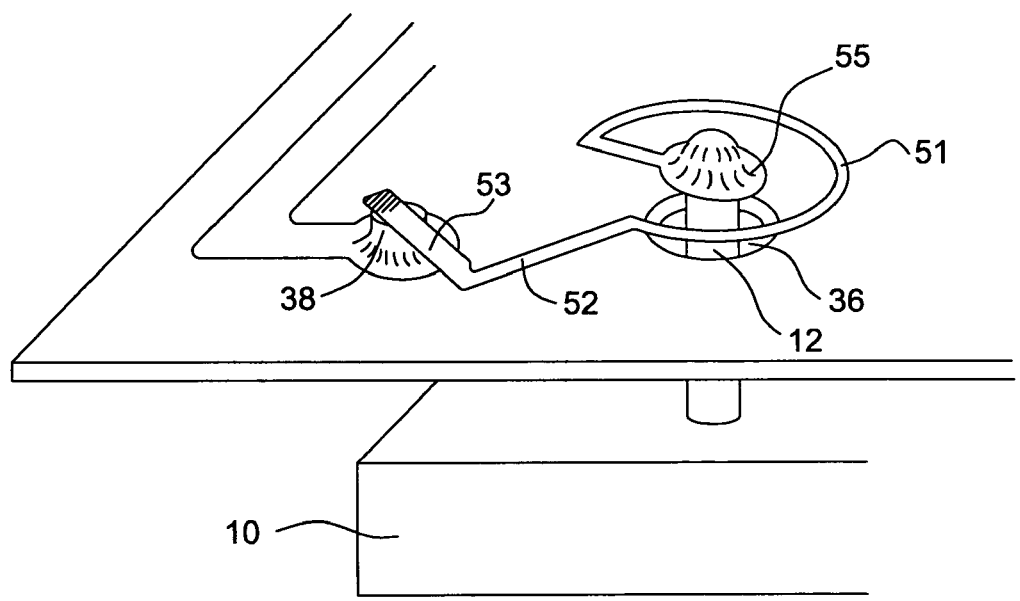
FIG. 5 represents the soldered conductive connection.

FIGS. 4 and 5, which are perspective views of the front or upper face of the board 30, represent a last solution. A conductive metal spike 38 has been soldered to the center of the printed terminal (in principle after insertion of the spike into a hole at the center of the terminal 34) at the same time as the various components 32 of the board were soldered onto it. The second termination 55 is threaded onto the pin 12 (FIG. 4) after the board has been placed above the cell 10 wedged in the package by the damping blocks; the first termination is placed above the spike 38. The soldering operation is then carried out (FIG. 5) on the two terminations. The ring 55 is soldered over its entire periphery to the pin 12; the end of the termination 53 is soldered to the conductive spike.

It will be noted that the width reduction between the ring 55 and the segment 54, or between the termination 53 and the segment 52, confines the soldering on the ring 55 and the termination 53 and prevents the solder from wetting the short segments 52 and 54, which would increase the stiffness of the connection.

The angle which the bar 53 forms with the segment 52, and the length of the bar 53, depend on the configuration of the printed circuit on the board and, more precisely, the position of the conductive terminal with respect to the pin to which it is intended to be connected.

After the soldering operation, it can be seen that relative movements of the board and the cell are possible: the stiffness of the connection is very low in all three dimensions, and deflection is possible because the hole 36 has a diameter greater (for example 1 millimeter greater) than the diameter of the pin 12 and because a vertical space (for example 1 millimeter) is formed between the circle-arc strip 51 and the board. The advantage of using a conductive spike 38 is that a free space can be formed between the conductive connection and the board over the entire length of the strip constituting the connection. Even in the absence of a spike, however, provision will in any case be made for at least the circle-arc portion 51 of the connection to be separated from the board, so as not to impede the vertical movements of the sensor cell with respect to the board in case of shock or vibrations.

Figure 6:
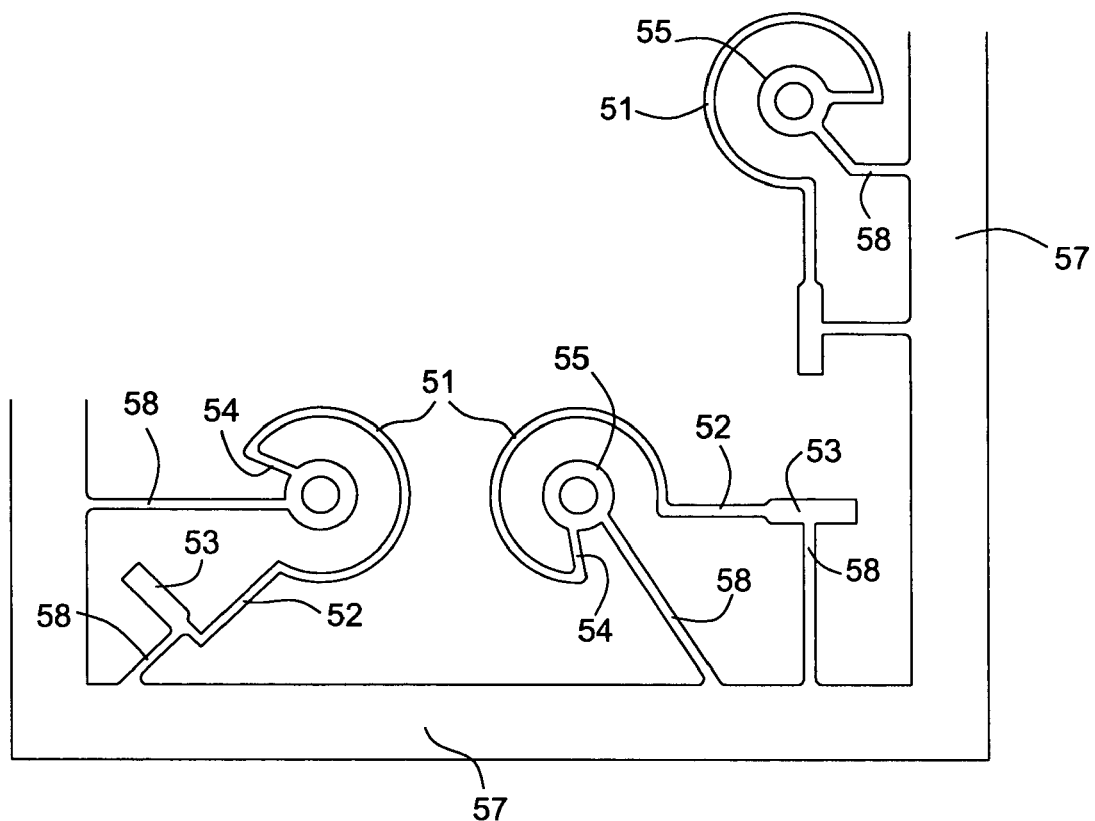
FIG. 6 represents a metal sheet comprising a plurality of conductive connections cut out.

FIG. 6 represents the collective manufacture of the sheet in order to produce and mount the various conductive connections simultaneously on the various pins of the cell. The pattern cut out from the sheet comprises the various connections, correctly positioned with respect to one another in view on the one hand of the relative position of the various pins of the cell and the position of the conductive terminals to which these pins are to be connected.

The (circle-arc) segments 51, the segments 52, 54 (connected to the circle arc) and the rings 55 are preferably all identical from one connection to another, even though they have different orientations from one connection to another, in order to minimize the structural asymmetries, particularly in the case of an accelerometer which is a type of sensor highly sensitive to asymmetries in the stresses which it experiences.

The connections are joined to a frame 57, which holds them in place during the soldering operation: bridges 58 between the terminations and the frame 57 are used for this holding. After the soldering operation, these bridges are removed by cutting. The example of FIG. 6 represents the metal sheet in the form of a rectangular peripheral frame 57, inside which only the connections 50 and the bridges are arranged. Provision may also be made for the cut metal sheet to consist of a rectangle, which has substantially the same area as the electronics board and which comprises on the one hand the connection and bridge cut-outs and on the other hand cut-outs around each component of the board so that the sheet can be placed on the board without being impeded by the components. The solid parts of the board, between the cut-outs provided around the components, then constitute the frame to which the bridges are attached.

The thin metal sheet may be cut by photolithography from a continuous strip in order to produce not only all the conductive connections between the cell and the board of a sensor but also the connections of a series of sensors in continuous mass production, which further reduces the manufacturing cost. The operations of positioning, soldering and cutting the bridges may be carried out by an automatic machine.

Figure 7:
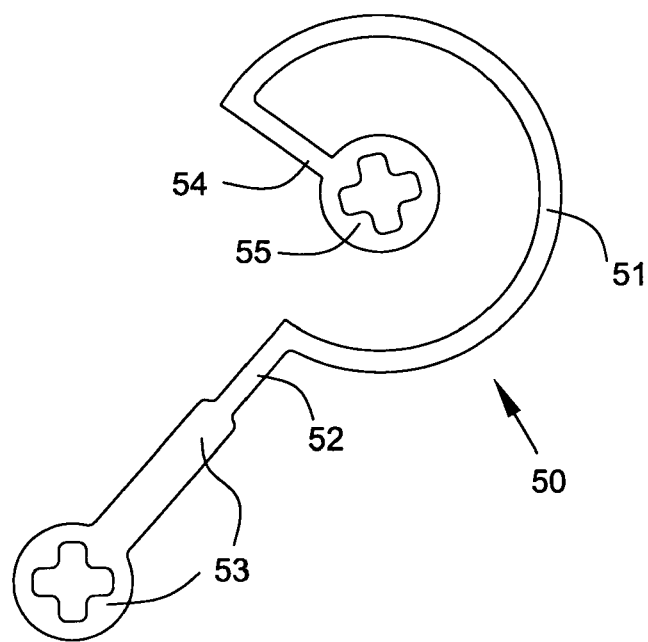
FIG. 7 represents an alternative embodiment of the conductive connections.

FIG. 7 represents an alternative embodiment of an individual connection: in this example, provision is made for the conductive termination 55 to be a ring whose inner cut-out is a fluted shape which facilitates positioning on the pin at a specific height (the ring wedges itself onto the pin); provision is furthermore made for the termination 53 to comprise a ring shape (also fluted if need be) which will be threaded onto the conductive spike, for instance the spike 38 previously soldered onto the board.

In the preceding figures, the segment 54 which joins the ring 55 to the circle arc 51 is turned radially toward the inside of the circle arc, and the pin 12 is at the center of this arc. The segment 55 could nevertheless depart in another direction, even toward the outside of the arc or in extension of the arc, the pin not being at the center of the arc or even necessarily inside the arc. These solutions are less compact than the solution with the pin at the center of the arc, although they may also be used.

The invention claimed is:

1. A sensor comprising:
   a package,
   a microsensor cell wedged in the package by damping blocks, and
   an electronics board comprising electronic circuits associated with the cell, the cell comprising connection pins, flexible conductive connections being provided between the connection pins and printed conductors of the board, wherein each conductive connection comprises a thin and flexible metal strip machined by cutting, extending between the pin and a printed conductor passing close to the pin, the strip being electrically connected on the one hand to the conductor and on the other hand to the pin and comprising, between the conductor and the pin, an arc-shaped segment parallel to the plane of the board and extending freely above the board with a space between the strip and the board.

2. The sensor as claimed in claim 1, wherein the strip is electrically connected to the pin and to the printed conductor by soldering.

3. The sensor as claimed in claim 1, wherein the arc-shaped segment is a circle arc centered on the pin.

4. The sensor as claimed in claim 1, wherein the arc-shaped segment extends over an angular sector of at least 180°.

5. The sensor as claimed in claim 1, wherein the strip comprises at least one ring termination threaded over the pin or over a conductive spike, the ring being soldered to this pin or this spike.

6. The sensor as claimed in claim 5, wherein the arcuate segment is supplemented by two segments substantially extending radially with respect to a center constituted by the pin.

7. The sensor as claimed in claim 6, wherein the radially extending segments (52, 54) are supplemented by segments with a width greater than that of the latter.

8. The sensor as claimed in claim 1, wherein the strip is cut from a sheet of copper and beryllium alloy.

9. The sensor as claimed in claim 1, comprising a plurality of strip-shaped conductive connections having an arc-shaped segment, the arc-shaped segments of the various connections being all identical.

10. A method of manufacturing a sensor comprising a package in which a microsensor cell, wedged in the package by damping blocks, and a printed circuit board associated with the cell are mounted, the method comprising the following steps:

machining a thin and flexible metal strip by cutting so as to form a plurality of narrow strip-shaped conductive connections from this strip, which have a very small stiffness in all directions, each connection comprising a segment curved in an arc in the plane of the sheet, these connections each being intended to connect a respective connection pin of the cell to a printed circuit conductor of the board which passes close to the pin, the various connections being joined together by bridges forming part of the sheet, placing the cell close to the board and soldering each connection on the one hand to a pin and on the other hand to a corresponding conductor, while leaving a free space above the board between the arcuate segment of the narrow strip and the board, and cutting the bridges between connections in order to separate them from one another.

11. The method as claimed in claim 10, wherein the machining of the sheet is chemical machining by photolithography.

12. The method as claimed in claim 11, wherein the cutting of the sheet includes the cutting of openings at the positions where components are placed on the board, the sheet being placed on the board onto which components have previously been soldered.

13. The method as claimed in claim 11, wherein not only the components but also conductive spikes are soldered onto the board, and the conductive connection is soldered to the free end of these spikes.

14. The method as claimed in claim 11, wherein the narrow strip comprises at least one ring-shaped termination, and in that this ring is threaded around a pin of the cell or a conductive spike soldered onto the board, before soldering the ring onto the pin or spike.

15. The method as claimed in claim 10, wherein the cutting of the sheet includes the cutting of openings at the positions where components are placed on the board, the sheet being placed on the board onto which components have previously been soldered.

16. The method as claimed in claim 15, wherein not only the components but also conductive spikes are soldered onto the board, and the conductive connection is soldered to the free end of these spikes.

17. The method as claimed in claim 15, wherein the narrow strip comprises at least one ring-shaped termination, and in that this ring is threaded around a pin of the cell or a conductive spike soldered onto the board, before soldering the ring onto the pin or spike.

18. The method as claimed in claim 10, wherein not only the components but also conductive spikes are soldered onto the board, and the conductive connection is soldered to the free end of these spikes.

19. The method as claimed in claim 18, wherein the narrow strip comprises at least one ring-shaped termination, and in that this ring is threaded around a pin of the cell or a conductive spike soldered onto the board, before soldering the ring onto the pin or spike.

20. The method as claimed in claim 10, wherein the narrow strip comprises at least one ring-shaped termination, and in that this ring is threaded around a pin of the cell or a conductive spike soldered onto the board, before soldering the ring onto the pin or spike.

* * * * *